(12) United States Patent
Kawamura et al.

(10) Patent No.: US 8,124,523 B2
(45) Date of Patent: Feb. 28, 2012

(54) FABRICATION METHOD OF A SEMICONDUCTOR DEVICE AND A SEMICONDUCTOR DEVICE

(75) Inventors: Kohei Kawamura, Hillsboro, OR (US); Toshihisa Nozawa, Amagasaki (JP); Takaaki Matsuoka, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 374 days.

(21) Appl. No.: 12/531,519

(22) PCT Filed: Mar. 28, 2008

(86) PCT No.: PCT/JP2008/056745
§ 371 (c)(1),
(2), (4) Date: Sep. 16, 2009

(87) PCT Pub. No.: WO2008/126776
PCT Pub. Date: Oct. 23, 2008

(65) Prior Publication Data
US 2010/0025856 A1 Feb. 4, 2010

Related U.S. Application Data

(60) Provisional application No. 60/922,593, filed on Apr. 10, 2007.

(30) Foreign Application Priority Data

Apr. 10, 2007 (JP) ................................. 2007-103313

(51) Int. Cl.
*H01L 21/3213* (2006.01)
*H01L 23/485* (2006.01)
(52) U.S. Cl. ........ 438/623; 438/637; 438/670; 438/951; 257/E21.577; 257/E21.587

(58) Field of Classification Search .................. 438/623, 438/637, 670, 951; 257/E21.577, E21.587
See application file for complete search history.

(56) References Cited

U.S. PATENT DOCUMENTS 7,803,705 B2 * 9/2010 Kobayashi et al. ........... 438/623
(Continued)

FOREIGN PATENT DOCUMENTS
CN 1310471 8/2001
(Continued)

OTHER PUBLICATIONS

Chinese Office Action mailed Jan. 11, 2011 with English translation.
(Continued)

*Primary Examiner* — George Fourson, III
(74) *Attorney, Agent, or Firm* — IPUSA, PLLC (57) ABSTRACT

A method for fabricating a semiconductor device includes the steps of (a) forming a plasma of a gas having carbon and fluorine, and forming an internal insulation film provided with a fluorine-doped carbon film formed on a substrate using the plasma; (b) forming a metal film on the internal insulation film; (c) etching the metal film according to a pattern to form a hard mask; (d) forming a concave part in the fluorine-doped carbon film by etching the fluorine-doped carbon film using the hard mask; (e) forming a film formation of a wiring material on the substrate for filling the concave part with the wiring material; (f) removing an excess part of the wiring material and the hard mask on the fluorine-doped carbon film for exposing a surface of the fluorine-doped carbon film; and (g) removing an oxide formed on the surface of the fluorine-doped film.

9 Claims, 8 Drawing Sheets

U.S. PATENT DOCUMENTS

| | | |
|---|---|---|
| 7,875,549 B2 * | 1/2011 | Nishizawa et al. ............ 438/623 |
| 7,960,226 B2 * | 6/2011 | Block et al. .................... 438/239 |
| 2001/0030169 A1 | 10/2001 | Kitagawa et al. |
| 2003/0040172 A1 | 2/2003 | Brennan |
| 2003/0152714 A1 * | 8/2003 | Nakase ........................ 427/457 |
| 2004/0266106 A1 | 12/2004 | Lee |
| 2010/0025856 A1 * | 2/2010 | Kawamura et al. ............ 257/773 |
| 2010/0244204 A1 * | 9/2010 | Matsuoka et al. ............ 257/632 |
| 2010/0317188 A1 * | 12/2010 | Nishizawa et al. ............ 438/643 |

FOREIGN PATENT DOCUMENTS

| | | |
|---|---|---|
| JP | 2001-358218 | 12/2001 |
| JP | 2003-100724 | 4/2003 |
| JP | 2004-311625 | 11/2004 |
| JP | 2005-026659 | 1/2005 |
| JP | 2005-302811 | 10/2005 |
| JP | 2006-135303 | 5/2006 |
| JP | 2006-278635 | 10/2006 |
| JP | 2007-027177 | 2/2007 |
| KR | 10-2006-0026223 A | 3/2006 |

OTHER PUBLICATIONS

Korean Office Action mailed Apr. 15, 2011 with partial translation.

Chinese Office Action dated Jun. 29, 2010 with English translation.

* cited by examiner

(a) 1,1,1,2,2,5,5,5 -Octafluoro-1-pentyn (b) 1,1,2,3,4,5,5,5 -Octafluoro-1,3-pentadiene

FABRICATION METHOD OF A SEMICONDUCTOR DEVICE AND A SEMICONDUCTOR DEVICE

The present invention is based on Japanese Priority Application 2007-103313 filed on Apr. 10, 2007, and U.S. patent application Ser. No. 60/922,593 filed on Apr. 10, 2007, the entire contents of which are hereby incorporated herein by reference.

TECHNICAL FIELD

The present invention relates to a fabrication method for a semiconductor device including an internal insulation layer of a fluorine-doped carbon film and a semiconductor device including the fluorine-doped carbon film.

BACKGROUND ART

Multilayer wiring structures are used to increase the integration of semiconductor devices.

Although multilayer wiring structures are applied to increase the integration of semiconductor devices, it becomes easier for signals to transmit through internal insulation layers as the signal frequencies increase. Therefore, it is required to reduce the dielectric constants of the internal insulation layers for further increasing the operational speeds of semiconductor devices. In general, a $SiO_2$ film (silicon dioxide film) is used, and the relative dielectric constant (written as the dielectric constant in the following) of $SiO_2$ is 4.0 and as lesser dielectric constant material, a SiOF film with a dielectric constant of 3.6 is under investigation. Recently, a SiOCH film as a low dielectric material having a dielectric constant of 2.8-3.2 has become in practical use. Thus, a stream of research and development of internal insulation layers is developing technology based on silicon (Si) dominated material doped with fluorine or carbon.

For such requirement, a fluorine-doped carbon film (fluorocarbon film) is being investigated for application as a material with a low dielectric constant at less cost relative to conventional materials. The fluorine-doped carbon film can have its dielectric constant lowered to be about 1.8, and it is believed that the fluorine-doped carbon film is a promising film as an internal insulation layer that is applicable to high speed operation devices. On the other hand, the fluorine-doped carbon film includes carbon as the dominant element, and the characteristics of the fluorine-doped carbon film are quite different from those of a conventional film. For example, compared to a film that includes silicon as the dominant element, there are disadvantages of the fluorine-doped carbon film including less heat resistance, low mechanical strength, and low etching resistance to plasma etching processes.

Thereby, a multilayer structure formed with fluorine-doped carbon films applied for a semiconductor device and the fabrication method are different from those of the conventional film that consists of silicon as the dominant element. The following briefly describes a wiring pattern formation process, a dual damascene process using a fluorine-doped carbon film (F-doped carbon film) for applying an internal insulation layer.

Figure 8:
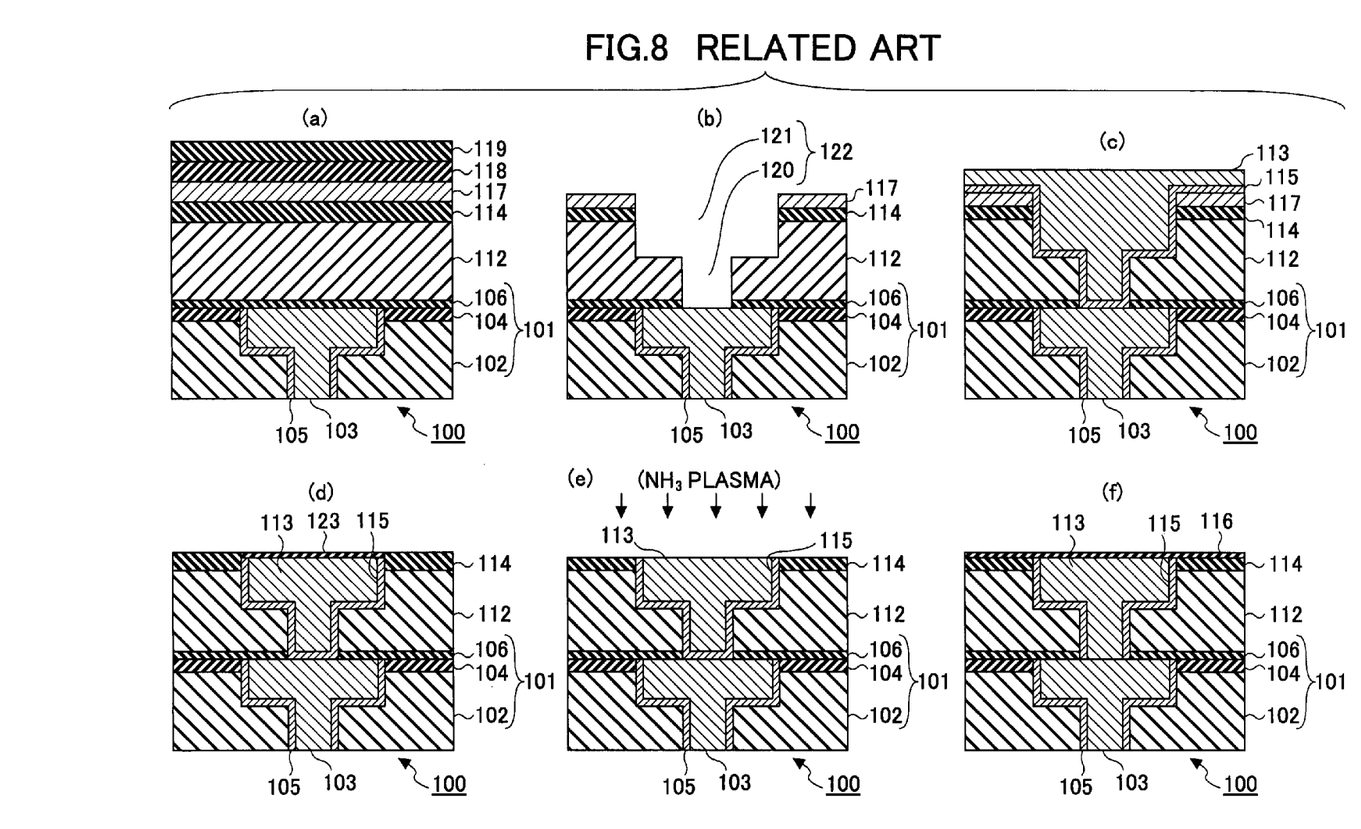
FIG. 8 is an illustrative drawing of a cross-sectional view of a semiconductor device showing the fabrication process forming a CF film using $C_5F_8$ gas having a conventional ring structure.

FIG. 8(a) shows a process step in the middle of the process forming an upper circuit layer on a lower circuit layer 101 that is formed on a substrate 100. There are a F-doped carbon film 102, a copper (Cu) wiring layer 103, a capping film 104 made of such as SiCN (silicon carbon nitride), a barrier metal film 105, and a barrier film 106 for preventing the diffusion of the wiring material (Cu, in this case) into the F-doped carbon layer 102. On the lower circuit layer 101, a multilayer film is formed from the bottom to the top: a F-doped carbon film 112, a capping film 114, a metal film 117 made of such as Ti (titanium), a sacrificial film 118, and a photoresist mask 119. The F-doped carbon film 112 (102) is formed by exposing the substrate 100 to an atmosphere of plasma being generated from treatment gas that includes a $C_5F_8$ gas with a ring structure, such as carbon fluoride gas.

After forming the multilayer structure shown in FIG. 8(a), a formation process of a concave part 122 is performed for the F-doped carbon film 112 as shown in FIG. 8(b). This process includes forming the sacrificial film 118 using the photoresist mask 119, a viahole 120 for the F-doped carbon film 112 using the sacrificial film 118, and a trench 121 (trench for wiring material) in the F-doped carbon film 112 using a hard mask that is formed by patterning the metal film 117. Next, as shown in FIG. 8(c), a barrier metal film 115 is formed to cover the inside of the concave part 122 and the exposed surface of the wiring layer 103, followed by filling the concave part 122 with the wiring material, copper 113. Next, an excess of the copper 113 and the metal film 117 are removed by CMP (Chemical Mechanical Polishing), as shown in FIG. 8(d).

In the CMP process, to protect the F-doped carbon film 112 from the direct mechanical force, as shown in FIG. 8(d), the CMP process is stopped to retain part of the capping film 114. Further, an oxidized film 123 is formed on the surface of the wiring layer 113 by oxidization. If the oxidized film 123 is left on it, the resistance of the wiring layer 113 is increased. In order to deoxidize the oxidized film 123, as shown in FIG. 8(e), the substrate 100 is irradiated by plasma caused by excited ammonia ($NH_3$) gas (named $NH_3$ plasma). The F-doped carbon film 112 is etched if exposed to the $NH_3$ plasma. However, as described above, the capping film 114 remains on the surface, so that the capping film 114 acts as a protecting film so that the $NH_3$ plasma does not etch the F-doped carbon film 112 because the film 112 is not exposed. Following that, the barrier film 116 is formed over the entire substrate 100 including the surface of the wiring layer 113, and the forming process of the upper side circuit layer is completed (FIG. 8(f)). Further followed by succeeding similar processes, the multilayer structure of the semiconductor device is fabricated.

As described above, the capping film 114 acts as a protecting film of the F-doped carbon film 112 for the CMP process and the $NF_3$ plasma irradiation, and furthermore it acts as an adhesive layer to stick the metal mask, the metal film 117 and the F-doped carbon film 112. Thus, as described below showing an experimental result of a comparative example 2-1, when a metal film made of Ti is directly formed on an F-doped carbon film obtained from a ring-structured $C_5F_8$ gas, the metal film 117 delaminates. Therefore, in terms of providing the intermediate capping film made of SiCN, SiC or SiN, the adhesion of the F-doped carbon film 112 and the metal film 117 is maintained.

Although the capping film 114 is not used for a conventional internal insulation film 112 of silicon related material, the F-doped carbon film 112 has been required recently because of the advantage of the low dielectric constant property. On the other hand, as the semiconductor device becomes thinner, the F-doped carbon film 112 as an internal insulation film is required to be thin. The materials of the capping film 114, SiCN (dielectric constant: about 5), SiC (dielectric constant: about 7), or SiN (dielectric constant: about 8) have relatively high dielectric constants. When the F-doped carbon film is used as part of the internal insulation film 112, the high dielectric constant of the capping film 114 becomes dominant when the internal insulation film 112 becomes thin. Namely, due to the high dielectric constant of the capping film 114, the effective dielectric constant of the internal insulation film 112 increases with decreasing film thickness, and even if the F-doped carbon film having a low dielectric constant of 1.8, is used, the advantage of the F-doped carbon film becomes less effective.

Further, the capping film 114 is used to compensate for the disadvantages of the F-doped carbon film regarding heat resistance and strength. But the capping film 114 is not essential for fabricating devices. Thereby, it may be regarded that the capping film 114 formation is an additional film formation process. Furthermore, the metal film 117 as a hard mask is necessary for the succeeding process, and it is required to choose an etching gas while maintaining a selectivity of etching rates for the metal film 117 as a hard mask. Further, in some cases, a cleaning treatment process may be required to remove the remaining substances generated while etching the capping film 114. Therefore, for a F-doped carbon film, in may be regarded that the number of process steps increases, which becomes a throughput reduction factor, and additional equipment may be necessary for performing the process.

On the other hand, one topic about a F-doped carbon film is described in a patent reference 1. However, there is no topic on the subject described above.
Patent Reference 1 Japanese Laid Open Patent Application 2005-302811.

DISCLOSURE OF THE INVENTION

The president invention is related to a material of an internal insulation film, and more specifically, related to a fluorine-doped carbon film having a low dielectric constant. The present invention may provide a semiconductor device and a semiconductor device fabrication utilizing method an advantage of the fluorine-doped carbon film. In addition, the present invention may provide a fabrication method that enables simplifying the process steps of the semiconductor device fabrication.

Means to Solve the Problems

One aspect according to the present invention provides a method for fabricating a semiconductor device, comprising the steps of:

(a) forming a plasma of a gas having carbon and fluorine, and forming an internal insulation film provided with a fluorine-doped carbon film formed on a substrate using the plasma;

(b) forming a metal film on the internal insulation film;

(c) etching the metal film according to a pattern to form a hard mask;

(d) forming a concave part in the fluorine-doped carbon film by etching the fluorine-doped carbon film using the hard mask;

(e) forming a film of a wiring material on the substrate for filling the concave part with the wiring material;

(f) removing an excess part of the wiring material and the hard mask on the fluorine-doped carbon film for exposing a surface of the fluorine-doped carbon film; and (g) removing an oxide formed on the surface of the fluorine-doped carbon film.

Further, another aspect of the present invention provides a semiconductor device comprising:

a lower circuit layer having an internal insulation film comprising a fluorine-doped carbon film and a wiring material filled in the internal insulation film;

a barrier film formed directly on the lower circuit layer to suppress diffusion of the wiring material;

another internal insulation film having a fluorine-doped carbon film formed on the barrier film; and an upper circuit layer provided by supplying another wiring material to fill in the internal insulation film.

Effect of the Invention

According to one aspect of the invention, an increase in an effective dielectric constant of the internal insulation films locating between an upper layer wiring and a lower layer wiring is suppressed, so that the advantage on a fluorine-doped carbon film, having a low dielectric constant, is applied to a semiconductor device having a fluorine-doped carbon film that is used as an internal insulation film. In a conventional case, a capping film such as a SiCN film having a relatively high dielectric constant is used for bonding a metal film used as a hard mask and the fluorine-doped carbon film. The capping film is provided between two layers of fluorine-doped carbon films for protecting films while polishing a wiring material and the successive process. Further, a film formation process of a capping film and the successive etching and a wet treatment of the capping film are not necessary, so that the semiconductor fabrication may be simplified, unlike the conventional case.

BEST MODE FOR IMPLEMENTING THE INVENTION

First Embodiment

Figure 1:
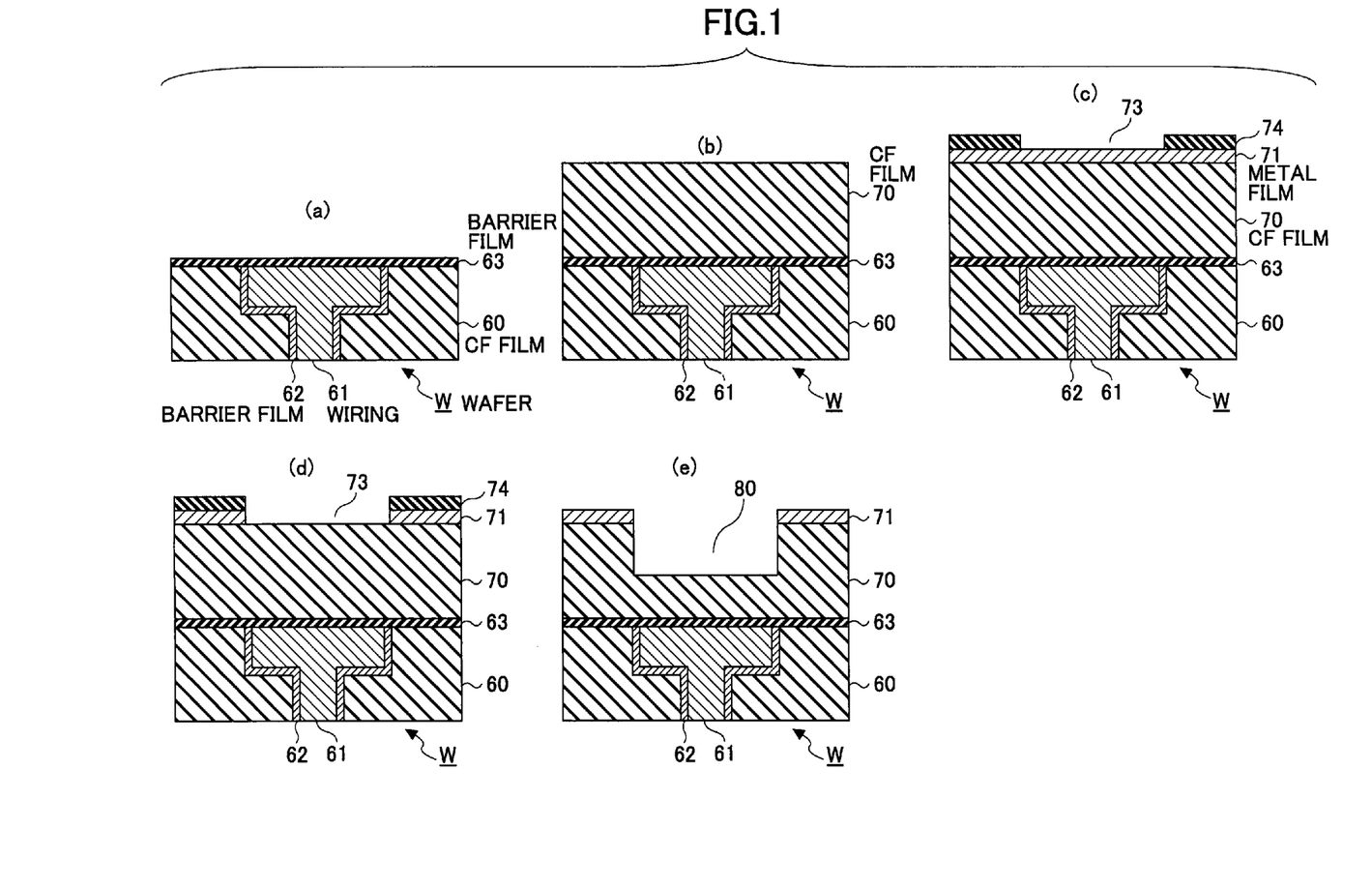
FIG. 1 is a diagram showing one example of a fabrication method of a semiconductor device according to the present invention.

With reference to FIG. 1, an embodiment of a fabrication process of the semiconductor device related to the present invention is explained. FIG. 1(a) shows a number n (lower side) circuit layer formed on a wafer W which is a substrate. The circuit layer includes that a metal wiring 61 made of such as Cu is supplied to fill in a fluorine-doped carbon film (written as a CF film in the following) 60 that is an internal insulation film. There is a barrier metal film 62 between the CF film 60 and the wiring 61 for preventing the diffusion of the wiring 61 material into the CF film 60, where the barrier metal film 62 is formed by a multilayer that is formed from the bottom side (CF film 60 side) in order of a titanium nitride (TiN) film and a tantalum (Ta) film. Further, a barrier film 63 made of SiC or the like is formed on this circuit layer for preventing metal diffusion into the CF film 70, which is the number (n+1) layer from the wiring 61. In the following explanation, the number n layer is written as a lower side, and the number (n+1) layer is written as an upper layer.

Figure 4:
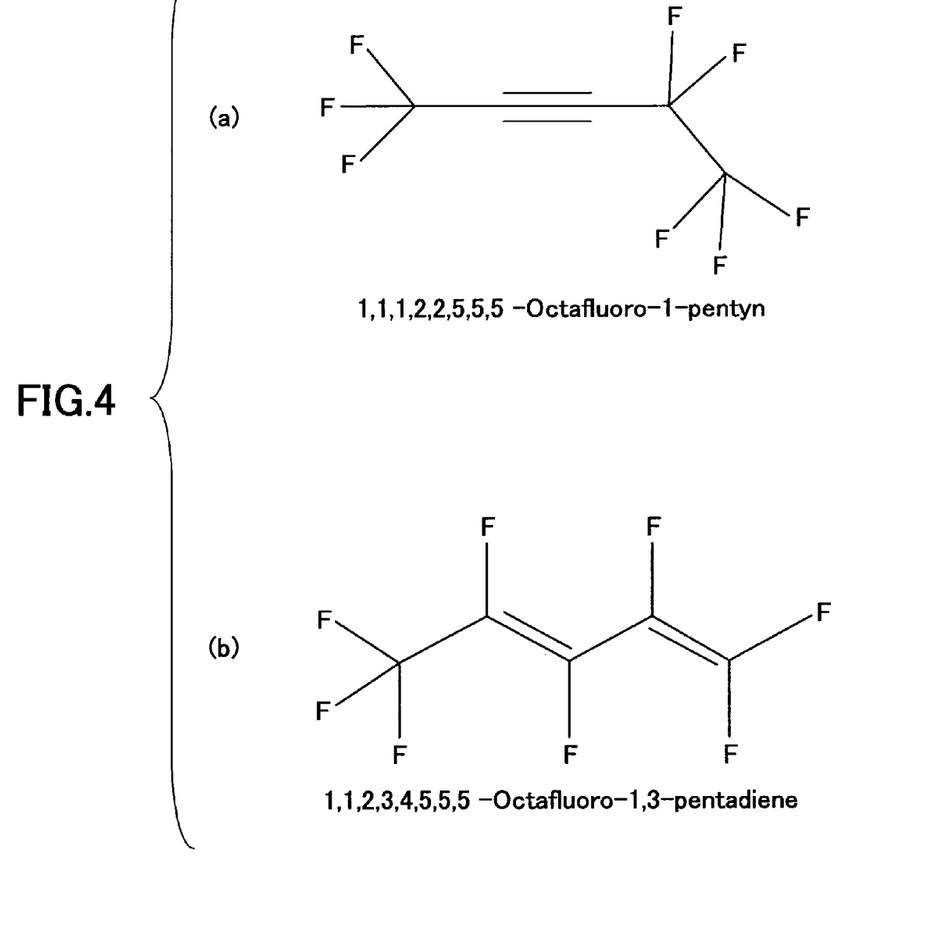
FIG. 4 is an illustrative drawing showing $C_5F_8$ gas used in this embodiment.

First, as shown in FIG. 1(*b*), a barrier film 63 is formed on the surface of a CF film 70. As described detail below, the CF film 70 is formed on a wafer W by providing plasma using $C_5F_8$ gas, being a film formation gas that is a compound gas containing carbon and fluorine having a straight-chain structure. The $C_5F_8$ gas having the straight-chain includes a triple bond between carbon-carbon atoms. For example, FIG. 4(*a*) shows 1,1,1,2,2,5,5-Octafluoro-1-pentyne gas including triple bonds. Further, 1,1,2,3,4,5,5,5-Octafluoro-1,3-pentyne gas having double bonds between carbon-carbon chemical bond and the like as shown in FIG. 4(*b*), may be used. In that case, the mechanical strength and heat resistance of the CF film are increased compared to that being formed by using $C_5F_8$ gas having a ring structure, because a dissociated substance having a reticular structure tends to be generated and is incorporated into the CF film 70, when plasma of $C_5F_8$ gas having triple bonds is formed.

Further, a metal film 71 such as Ti (titanium) is formed on the CF film 70 by using a sputtering method or the like, in which the metal film 71 is used as a hard mask when the CF film 70 is etched off. As the CF film 70 has high thermal stability, the adhesion property between a Ti film and the CF film 70 is improved. Examples are shown later as experiment example 2-1 and experiment example 3. Thus, the CF film 70 and the metal film 71 maintain their adhesion, and no capping film made of SiCN (silicon carbon nitride) film or the like is necessary. Further, the metal film 71 is not limited to the Ti film; Ta (tantalum), W (tungsten), Al (aluminum) and the like may be used as the metal film.

Next, a trench pattern 73 formed on the metal film 71 by a photoresist mask 74 (trench to be filled with wiring) as shown in FIG. 1(*c*), and the metal film 71 is etched off using the photoresist mask 74, so that a trench is formed as shown in FIG. 1(*d*). Pure metals are used for the metal film 71 to obtain high etching selectivity (e.g. over 100) between the underlying CF film 70 and the metal film 71 (hard mask) when the metal film 71 is etched off to form a hard mask pattern. Next etching gas is switched to etch the CF film 70 for forming a trench 80 using the hard mask of the metal film 71 (FIG. 1(*e*)). The photoresist mask 74 is removed when the CF film 70 is etched off, and the metal film (hard mask) 71 is left on a top layer of the wafer W.

Figure 2:
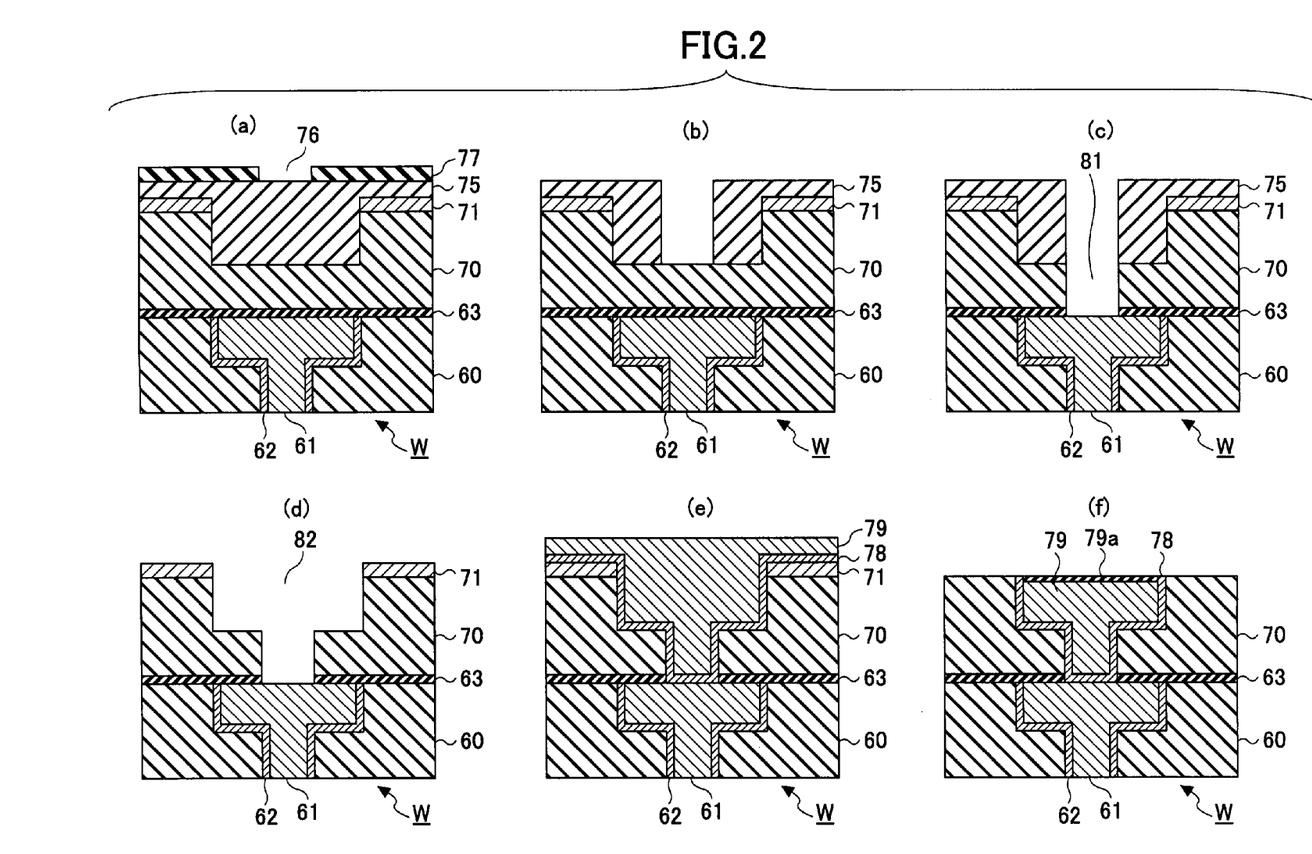
FIG. 2 is an illustrative drawing showing one example of the fabrication method of the semiconductor device.

Further, a SiOC (silicon oxide carbonate) related film, a sacrificial film 75 is formed by a spin coater method for covering the trench 80. A photoresist mask 77 is formed on a surface of the sacrificial film 75 for forming a viahole 76 (FIG. 2(*a*)). The photoresist mask 77 is used to etch off the sacrificial film 75, the CF film 70 and the barrier film 63 exposing at a bottom, so that a viahole 81 is formed (FIG. 2(*b*) through FIG. 2(*c*)). Next, the sacrificial film 75 is removed (FIG. 2(*d*)) by a chemical treatment, and thus a concave part 82 including the trench 80 and the viahole 81 is formed in the CF film 70.

A barrier metal 78 having the similar structure to the barrier metal 62 is formed by using a sputtering method or the like to cover all over the surface of the metal film 71 and an inner surface of the concave part 82. Next, an upper wiring 79 made of wiring material such as Cu is formed by a sputtering method or the like (FIG. 2(*e*)).

Figure 3:
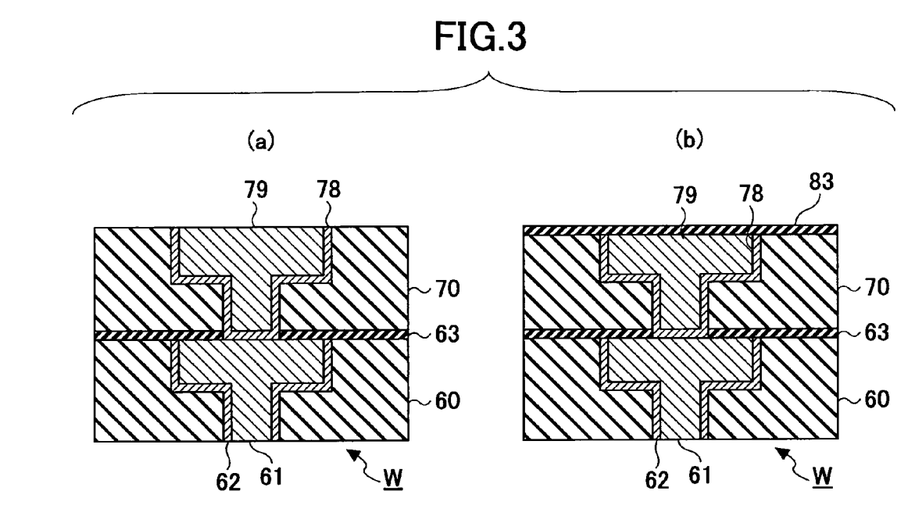
FIG. 3 is an illustrative drawing showing one example of the fabrication method of the semiconductor device.

Next, excess parts of Cu (wiring material), the barrier film 78, and the metal film 71 are removed by the CMP (Chemical Mechanical Polishing) technique. Thus, the upper wiring 79 is formed in the CF film 70. This CMP process is performed by chemically mechanically polishing the wafer W with a pad made of a resin material such as urethane, where acid or alkaline slurry is provided on the pad and the pad and the wafer W are mutually pressed and rotated so that the surface of the wafer W is polished. In the polishing process, unlike the conventional structure having a capping film, no capping film is formed on the CF film 70. Thus the surface of the CF film 70 is directly polished at the latter stage of the polishing process. The CF film 70, however, has enough mechanical strength as described above, so that damage affecting its device characteristics does not occur. An oxide layer 79*a* is formed (FIG. 2(*f*)) by friction heat during the polishing process on the surface of Cu (wiring 79). The oxide layer 79*a* is removed by using a reduction treatment (FIG. 3(*a*)) or the like, since wiring resistance is increased when the oxide layer 79*a* exists between the wiring 79 and a succeeding upper (n+2) wiring. The reduction treatment is performed by providing an organic acid such as formic acid vapor from a shower head that is located to face the wafer W on a stage in a process chamber 11. The reduction treatment using an organic acid may be performed by using a solution of an organic acid that is provided onto the wafer W instead of a vapor, and the organic acid may be a carbonxylic acid or the like without the formic acid.

Due to the reduction treatment, the oxide layer 79*a* turns into the metal (Cu). On the other hand, as the CF film 70 is not degraded or etched by such organic acid, the reduction treatment of the oxide layer 79*a* is performed without affecting the CF film 70.

For the reduction treatment, an annealing process (thermal treatment) may be performed by placing the wafer W in a reduction atmosphere such as a hydrogen atmosphere. The CF film 70 used in this embodiment has good heat resistance and gas desorption of F (fluorine) gas or the like is prevented while such annealing is performed. Further, a barrier film 83 is formed by the CVD (chemical vapor deposition) method on the surface of the wafer W for preventing metal diffusion from the wiring 79 into the (n+2) upper CF film (not shown). A predetermined number of layers of circuits are formed by repeating a series of the process steps performed above.

According to the above embodiment, the CF film 70 has good mechanical strength since the CF film 70 is formed by using $C_5F_8$ gas having a straight structure. During the CMP process that is performed after supply Cu (wiring 79), the CF film 70 is undamaged even when the surface of the wafer W is polished until the CF film 70 is exposed.

The reduction treatment after the CMP process of Cu oxide (oxide film layer 79*a*) is performed by using formic acid, and the CF film 70 is not etched by the formic acid. Thus the reduction treatment of the oxide layer 79*a* may be performed while the surface of the CF film 70 is exposed. Further, the CF film 70 formed by using $C_5F_8$ gas having a straight chain structure has high heat resistance. For example, when the CF film 70 is heated to 400° C., desorption of gas such as F gas or the like does not occur, then corrosion of the metal wiring due to F gas is prevented when a hydrogen sintering treatment is performed as a post process.

Therefore, this embodiment does not need a capping film in a dual damascene process for forming wiring, while the conventional dual damascene process for forming wiring needs a capping film. Thus a capping film having high dielectric material is not provided between the upper CF film 70 and the lower CF film 60. The increase in effective dielectric constant for all the internal insulation films (indicating CF film 70, a barrier film 63 and the like) formed between the upper wiring 79 and the lower wiring 61 does not occur, and the advantages of the CF film 70 (having a low dielectric constant) is applied. Especially, when an internal insulation film becomes thinner, the effect of a film having a high dielectric constant becomes dominant for the effective dielectric constant of all the internal insulation films. Therefore the present invention of a semiconductor device is extremely useful.

Further, there is no need for a capping film (104 and 114), 50 that no capping film formation process, no etching process of a capping film, and no wet treatment process to clean the surface of a wafer are necessary, which result in a simple process and improve the fabrication throughput. As an additional effect, selective etching for a capping film and a metal film 71 is not necessary, and therefore there is no need to investigate a proper etching condition (etching gas) which provides flexibility for choosing film materials of the metal film 71. Also, as the selectivity of the etching between the metal film 71 and the CF film 70 is large enough, it becomes simple to form a concave part 82 having an appropriate shape (high aspect ratio).

The metal film 71 as a hard mask is not limited to Ti, and other materials Ta, W, Al may be used. The film is formed by using a sputtering method or the like, and a thermal CVD method provided that the temperature of the film is less than 400° C.

Further, the present invention may include a fabrication method where a SiCN film or the like is formed between the CF film 70 and the metal film 71, the SiCN film is removed with a removing process of the metal film 71 by the CMP process, and there is no capping film 104 between a lower CF film 60 and an upper CF film 70.

Figure 5:
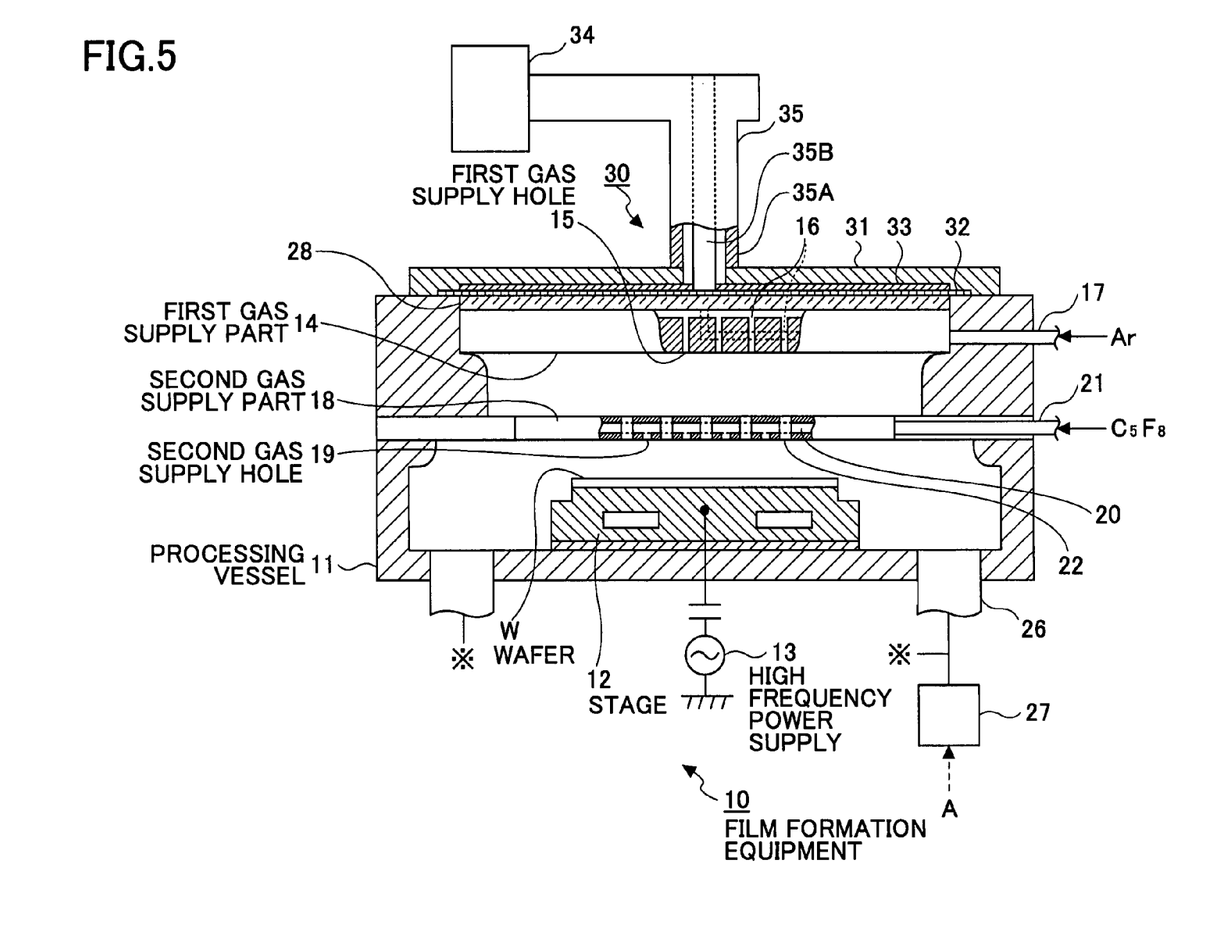
FIG. 5 is an illustrative drawing showing a cross sectional view of film formation equipment used for the semiconductor fabrication method of the semiconductor device.

Next, one example of equipment for forming a film 70 is briefly described using FIG. 5. Film formation equipment 10 includes a processing vessel 11, a stage 12 including a temperature control unit, and a high frequency power supply 13 connected to the stage 12 for providing high frequency power at a frequency of 13.56 MHz or the like. A first gas supply part 14 made of alumina or the like having an approximate round shape is provided in the upper part of the processing vessel 11 facing the stage 12.

A plane of the first gas supply part 14 facing the stage 12 includes numerous gas supply holes 15. The first gas supply holes 15 are connected to a gas supply source providing such as argon (Ar) gas, inert gas or the like through a first gas supply path 17 and a gas flow paths 16 for generating plasma. A second gas supply part 18 having an approximate round shape made of an electrical conducting material is provided between the stage 12 and the first gas supply part 14. A plane of the second gas supply part 18 facing the stage 12 includes numerous second gas supply holes 19. A gas flow path 20 is formed in the second gas supply part 18 communicating with the second gas supply holes 19, and connected to source gas such as $C_5F_8$ gas or the like having a straight chain structure through a second gas supply path 21. Further, numerous openings 22 are formed to penetrate the second gas supply part 18. The openings 22 are formed to allow the flow of the plasma generated in the upper part of the second gas supply part 18 into the lower part of the second gas supply part 18. For example, the openings 22 are formed between adjacent second gas supply holes 19. An exhaust outlet 26a is provided at lower level of the processing vessel 11 and connected to a vacuum exhaust system 27 through an exhaust tube 26.

An antenna part 30 is provided through a cover plate 28 made of a dielectric material, for example, alumina at the upper level of the first gas supply part 14. The antenna part 30 includes an antenna body 31 having an approximate round shape and a plane antenna material (slit plate) 32 formed in a bottom of the antenna body 31. The plane antenna member 32 includes numerous slits (not shown) to generate circular polarized waves. The antenna body 31 and the plane antenna member 32 are made of conducting materials and have a round-shaped wave guide tube with flat-shaped openings.

A retardation phase plate 33 made of a low loss dielectric material, for example, silicon oxide or silicon nitride is provided between the antenna body 31 and the plane antenna member 32. The retardation phase plate 33 is provided for shortening the wavelength of a microwave in the wave guide tube.

The antenna part 30 is connected to a microwave generation means 34 through a coaxial waveguide 35, where the microwave means 34 generates microwaves with a frequency ranging from approximate 2.45 GHz to approximate 8.4 GHz. Further, an outer tube 35A of the coaxial waveguide tube 35 is connected to the antenna body 31, and a core conductor 35B of the coaxial waveguide tube 35 is connected to the plane antenna member 32 through an opening part formed in the retardation phase plate 33.

In the following, the formation of a CF film 70 using the film formation equipment 10 above is described. First a wafer W is transferred into the processing vessel 11 and set onto the stage 12. The processing vessel 11 is evacuated by the vacuum exhaust system 27, and, for example, Ar gas and $C_5F_8$ gas having a straight chain structure are individually introduced into the processing vessel 11 via the first gas supply path 17 and the second gas supply path 21 with predetermined flow rates, respectively. The vacuum level in the processing vessel 11 is provided at a predetermined value, and the wafer W set on the stage 12 is heated by the heat control system.

The microwave generating means 34 radiates high frequency waves (microwaves) having a frequency of 2.45 GHz from the slits (not shown) of the plane antenna member 32 through the cover plate 28 and the first gas supply part 14 toward the lower processing space.

Ar gas is excited by the microwaves resulting in Ar plasma being formed in the space between the first gas supply part 14 and the second gas supply part 18. The $C_5F_8$ gas introduced through the second gas supply path 21 onto the stage 12 generates active species of the $C_5F_8$ gas by collision with the Ar plasma flowing from the upper side of the processing space through the openings 22. A CF film 70 is formed on the wafer W by providing the active species on the wafer W.

EMBODIMENT

Experimental Example 1

When a silicon compound related film, for example a SiCN film was used as the above described capping layer, it remained as part of an internal insulation film. An effect on a SiCN film in an internal insulation film for a dielectric constant was investigated in the following. In the experiment, different structures were formed. The thicknesses of CF films were varied from 100 nm to 375 nm by 25 nm steps, and each of the films was formed on a 20 nm thick SiCN film. Another 20 nm thick SiCN film was formed on a CF film to sandwich the CF film. The dielectric constants of the structured films were measured by using the mercury probe system.

Experimental Result

Figure 6:
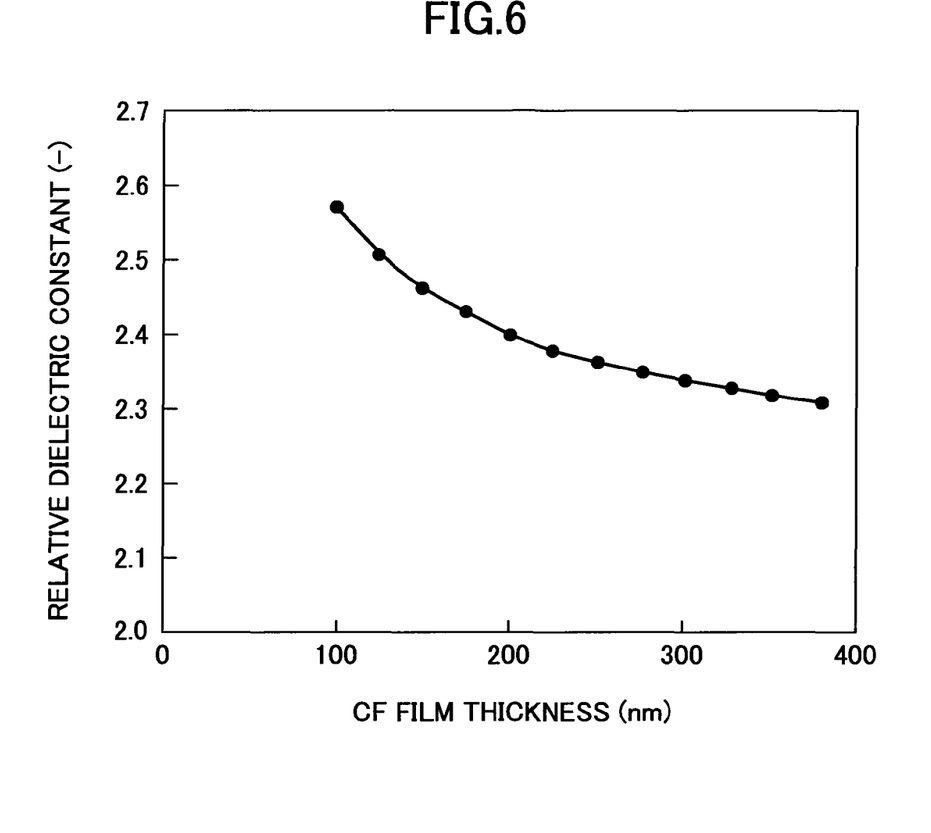
FIG. 6 is an illustrative drawing showing a characteristic of an experimental result according to an experiment 1.

The measurement results are shown in FIG. 6. It is seen that a dielectric constant of the structured internal insulation film increases with decreasing the film thickness of a CF film. This suggests that when the whole thickness of the internal insulation film decreases, the dielectric constant of the internal insulation film increases remarkably, which becomes non-negligible.

Experimental Example 2

Experimental Example 2-1

A CF film is formed on a wafer W by using the film formation equipment 10. $C_5F_8$ gas was used as source gas having a straight chain structure, and a Ti film was formed on the CE film by using a sputtering method. A thermal treatment was performed at 400° C. for 60 minutes in a vacuum atmosphere.

Comparing Example 2-1

Another CF film was formed on a wafer W using $C_5F_8$ gas as source gas having a ring structure in the same manner as the experimental example 2-1, and a Ti film was formed on the CF film.

Comparing Example 2-2

Another CF film was formed on a wafer W in the same manner as the comparing example 2-1. Further a Ta film was formed on the CF film, and a thermal treatment was performed at 350° C. for 30 minutes.

Experimental Result

In the experimental example 2-1, there was neither delamination of the Ti film nor a void formed between the Ti film and the CF film, and the formed film showed uniform color and had a good condition. For the comparing example 2-1, there was delamination of the Ti film after film formation. For the comparing example 2-2, delamination of the Ta film was not seen after film formation, but delamination of the Ta film was seen everywhere on the wafer W after the thermal treatment. It may be regarded that the different results between the comparing examples 2-1 and 2-2 are caused due to the difference between the reaction properties of Ta film and Ti film.

The results above indicate that film formation using $C_5F_8$ gas having a straight chain structure does not cause gas desorption, since no void was seen after thermal treatment. It is expected from the results above that desorption of F gas will not occur when the CF film is used for transistor formation in the fabrication process of LSI (large scale integrated circuits), where hydrogen sintering is performed at approximate 400° C. to reduce the interface state density of the gate oxide film of a transistor, thus no corrosion of wiring material due to F gas is expected to occur. On the other hand, the CF film formed using $C_5F_8$ gas having a ring structure shows delamination of metal films by reaction between metal and desorption gas due to the thermal treatment, and has less heat resistance compared to the CF film formed by using C5F8 having a straight chain structure.

Experimental Example 3

Figure 7:
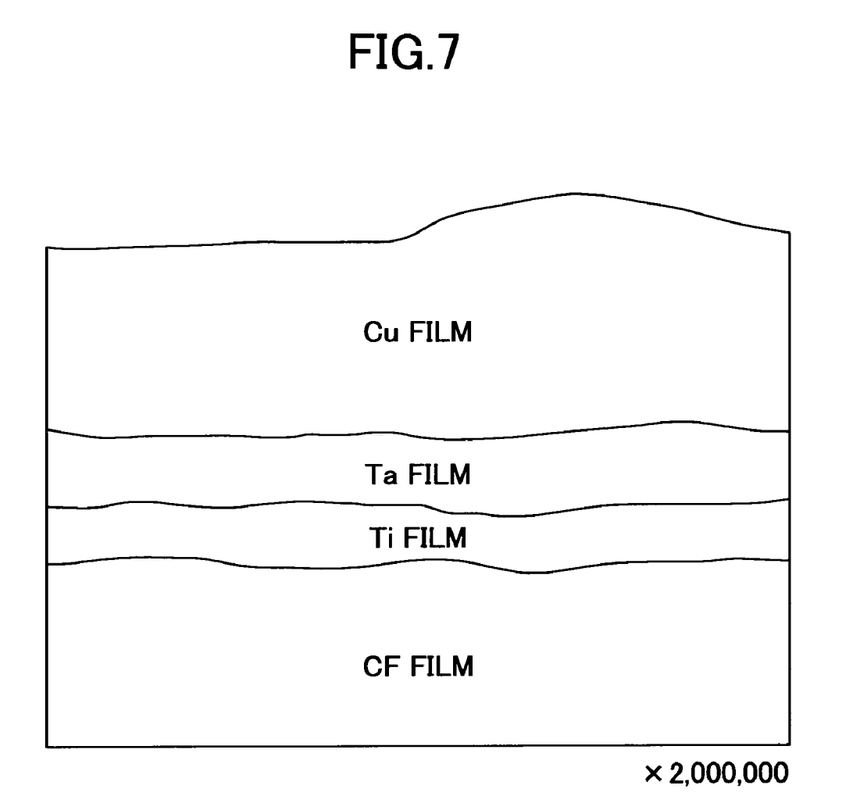
FIG. 7 is an schematic illustration of a TEM photograph of a wafer after performing an experiment 3.

The film formation equipment 10 is used for forming a CF film on a wafer W using $C_5F_8$ gas having a straight chain structure, followed by forming a 3 nm thick Ti film, a 7 nm thick Ta film, and a 15 nm thick Cu film, and followed by a thermal treatment of 400° C. for 60 minutes. Next, a picture of the cross-sectional view of the sample was taken by TEM (transmitting electron microscopy) observation. The result is shown in FIG. 7. It is seen in the figure that any variation, such as delamination of films between each the films and diffusion of elements between the films did not occur. Therefore, it may be regarded that a CF film has enough heat resistance and offers no difficulty for the direct film formation of metal, such as a Ti film or the like on the CF film.

The invention claimed is:

1. A method for fabricating a semiconductor device, comprising the steps of:
   (a) forming an internal insulation film comprising a fluorine-doped carbon film on a substrate using a plasma formed by a gas having carbon and fluorine;
   (b) forming a metal film on the internal insulation film;
   (c) etching the metal film to form a hard mask;
   (d) forming a concave part in the fluorine-doped carbon film by etching the fluorine-doped carbon film using the hard mask;
   (e) forming a film of a wiring material on the substrate for filling the concave part with the wiring material;
   (f) removing an excess part of the wiring material and the hard mask on the fluorine-doped carbon film for exposing a surface of the fluorine-doped carbon film; and
   (g) removing an oxide formed on the surface of the fluorine-doped film.

2. The method for fabricating a semiconductor device as claimed in claim 1, wherein the step (b) forms a metal film directly on the internal insulation film.

3. The method for fabricating a semiconductor device as claimed in claim 1, wherein the gas having carbon and fluorine is a $C_5F_8$ gas having a straight chain structure.

4. The method for fabricating a semiconductor device as claimed in claim 3, wherein the $C_5F_8$ gas includes a triple bond.

5. The method for fabricating a semiconductor device as claimed in claim 1, wherein the metal is one of Ti, Ta, W, and Al.

6. The method for fabricating a semiconductor device as claimed in claim 1, further comprising the steps of:
   forming a sacrificial film on the hard mask; and
   etching the fluorine-doped carbon film using the sacrificial film as a mask so that a concave part is formed in the fluorine-doped carbon film.

7. The method for fabricating a semiconductor device as claimed in claim 1, wherein the step (f) is provided by a process of polishing a surface of the wiring material.

8. The method for fabricating a semiconductor device as claimed in claim 1, wherein the step of (g) is performed by providing a liquid of an organic acid or a vapor of the organic acid onto a surface of the substrate.

9. The method for fabricating a semiconductor device as claimed in claim 1, wherein the step of (g) is provided by annealing the substrate in an atmosphere of reduction gas.

* * * * *